US008826668B2

(12) United States Patent
Lee et al.

(10) Patent No.: US 8,826,668 B2
(45) Date of Patent: Sep. 9, 2014

(54) TWO STAGE SERIAL IMPINGEMENT COOLING FOR ISOGRID STRUCTURES

(75) Inventors: Ching-Pang Lee, Cincinnati, OH (US); Jay A. Morrison, Titusville, FL (US)

(73) Assignee: Siemens Energy, Inc., Orlando, FL (US)

( * ) Notice: Subject to any disclaimer, the term of this patent is extended or adjusted under 35 U.S.C. 154(b) by 556 days.

(21) Appl. No.: 13/195,947

(22) Filed: Aug. 2, 2011

(65) Prior Publication Data

US 2013/0031914 A1 Feb. 7, 2013

(51) Int. Cl.

*H01L 23/46* (2006.01)
*F23R 3/06* (2006.01)
*F01D 9/02* (2006.01)
*F01D 25/12* (2006.01)
*F01D 5/18* (2006.01)

(52) U.S. Cl.

CPC ................ *F01D 5/186* (2013.01); *F01D 9/023* (2013.01); *F01D 25/12* (2013.01); *F05D 2260/202* (2013.01); *Y10S 165/908* (2013.01)
USPC ................. 60/755; 60/752; 60/806; 415/115; 415/178; 165/908

(58) Field of Classification Search

CPC ............ F23R 3/00; F23R 3/002; F23R 3/005; F23R 3/007; F23R 3/06; F23R 3/08; F23R 3/42; F23R 3/425; F23R 3/44; F23R 3/46; F23R 3/48; F23R 3/50; F23R 3/52; F23R 3/54; F23R 3/56; F23R 3/58; F23R 3/60; F23R 2900/03044; Y02T 50/675; F01D 9/023; F01D 5/08; F01D 5/084
USPC ........... 60/752, 753, 754, 755, 756, 757, 758, 60/759, 760, 262, 782, 785, 798, 806; 415/114, 115, 116, 117, 175, 178; 416/96 R, 96 A, 97 R; 165/908
See application file for complete search history.

(56) References Cited

U.S. PATENT DOCUMENTS 3,391,904 A * 7/1968 Albert et al. ............... 415/173.1
4,063,851 A * 12/1977 Weldon ....................... 416/97 A (Continued)

FOREIGN PATENT DOCUMENTS

JP 11-200805 7/1999

OTHER PUBLICATIONS

Ching-Pang Lee; "A Method of Fabricating a Nearwall Nozzle Impingement Cooled Component for an Internal Combustion Engine"; USPTO Unpublished U.S. Appl. No. 13/094,966, filed Apr. 27, 2011; 11 pages.

*Primary Examiner* — Gerald L Sung
*Assistant Examiner* — Michael B Mantyla

(57) ABSTRACT

A system for cooling a wall (24) of a component having an outer surface with raised ribs (12) defining a structural pocket (10), including: an inner wall (26) within the structural pocket and separating the wall outer surface within the pocket into a first region (28) outside of the inner wall and a second region (40) enclosed by the inner wall; a plate (14) disposed atop the raised ribs and enclosing the structural pocket, the plate having a plate impingement hole (16) to direct cooling air onto an impingement cooled area (38) of the first region; a cap having a skirt (50) in contact with the inner wall, the cap having a cap impingement hole (20) configured to direct the cooling air onto an impingement cooled area (44) of the second region, and; a film cooling hole (22) formed through the wall in the second region.

18 Claims, 5 Drawing Sheets

(56) References Cited

U.S. PATENT DOCUMENTS

| | | | | |
|---|---|---|---|---|
| 4,337,016 | A * | 6/1982 | Chaplin | 415/116 |
| 4,526,226 | A | 7/1985 | Hsia et al. | |
| 4,573,865 | A | 3/1986 | Hsia et al. | |
| 4,642,024 | A * | 2/1987 | Weidner | 415/116 |
| 4,650,394 | A * | 3/1987 | Weidner | 415/115 |
| 5,584,651 | A | 12/1996 | Pietraszkiewicz | |
| 6,036,441 | A | 3/2000 | Manning et al. | |
| 6,139,257 | A * | 10/2000 | Proctor et al. | 415/115 |
| 6,508,623 | B1 * | 1/2003 | Shiozaki et al. | 415/173.1 |
| 6,602,048 | B2 | 8/2003 | Fujikawa et al. | |
| 6,666,645 | B1 * | 12/2003 | Arilla et al. | 415/116 |
| 6,779,597 | B2 | 8/2004 | CeMarche et al. | |
| 6,899,518 | B2 * | 5/2005 | Lucas et al. | 415/116 |
| 7,008,183 | B2 * | 3/2006 | Sayegh et al. | 415/173.1 |
| 7,097,418 | B2 | 8/2006 | Trindade et al. | |
| 7,137,779 | B2 | 11/2006 | Liang | |
| 7,147,432 | B2 * | 12/2006 | Lowe et al. | 415/116 |
| 7,665,962 | B1 * | 2/2010 | Liang | 415/173.1 |
| 7,670,108 | B2 * | 3/2010 | Liang | 415/173.1 |
| 8,092,146 | B2 * | 1/2012 | Legare et al. | 415/1 |
| 8,123,466 | B2 * | 2/2012 | Pietraszkiewicz et al. | 415/116 |
| 8,137,056 | B2 * | 3/2012 | Fujimoto et al. | 415/116 |
| 8,246,299 | B2 * | 8/2012 | Razzell et al. | 415/173.1 |
| 8,439,636 | B1 * | 5/2013 | Liang | 415/213.1 |
| 8,475,121 | B1 * | 7/2013 | Liang | 415/173.1 |
| 2003/0131980 | A1 * | 7/2003 | DeMarche et al. | 165/169 |
| 2004/0047725 | A1 * | 3/2004 | Tomita et al. | 415/116 |
| 2006/0160225 | A1 * | 7/2006 | Gipp et al. | 436/18 |
| 2007/0209366 | A1 * | 9/2007 | Gerendas et al. | 60/752 |
| 2008/0206046 | A1 * | 8/2008 | Razzell et al. | 415/173.1 |
| 2009/0035125 | A1 * | 2/2009 | Fujimoto et al. | 415/116 |
| 2009/0067994 | A1 * | 3/2009 | Pietraszkiewicz et al. | 415/173.1 |
| 2010/0000197 | A1 * | 1/2010 | Snyder et al. | 60/39.5 |
| 2010/0266386 | A1 * | 10/2010 | Broomer et al. | 415/115 |
| 2011/0188993 | A1 * | 8/2011 | Bacha et al. | 415/115 |
| 2011/0229305 | A1 * | 9/2011 | Bergman et al. | 415/115 |
| 2013/0011238 | A1 * | 1/2013 | Liang et al. | 415/115 |
| 2013/0051972 | A1 * | 2/2013 | Romanov | 415/1 |

* cited by examiner

TWO STAGE SERIAL IMPINGEMENT COOLING FOR ISOGRID STRUCTURES

STATEMENT REGARDING FEDERALLY SPONSORED DEVELOPMENT

Development for this invention was supported in part by Contract No. DE-FC26-05NT42644, awarded by the United States Department of Energy. Accordingly, the United States Government may have certain rights in this invention.

FIELD OF THE INVENTION

This invention relates to staged impingement cooling of a wall of a component. More particularly, this invention relates to staged cooling of an outer surface of the wall when the outer surface forms discrete pockets.

BACKGROUND OF THE INVENTION

Gas turbine engine components that are subjected to high temperatures are often actively cooled in order to maintain the metal temperature within acceptable limits. Components that partially define a path for the hot combustion gasses are often cooled using impingement cooling of the cooled side and/or film cooling of the hot side. Impingement cooling may be accomplished using a structure with impingement cooling holes designed to direct cooling air onto the cooled side of the component. Manufacturing limitations and design considerations constrain the design of impingement cooling holes. For example, the impingement cooling holes must be sized to permit small particles typically present in the cooling air to pass through without clogging the impingement cooling hole. Additionally, the advantageous effects impingement cooling provides are limited to a relatively small area adjacent the location of impingement. Consequently, many impingement cooling holes are required in order to effectively cool an entire area of the component. Cooling air used for impingement cooling is taken from the gas turbine engine compressor and is redirected away from the combustor to be used in the impingement cooling system. When air is redirected from combustion and used for any other purpose, the engine efficiency is reduced. As a result, increasing the number of impingement cooling holes decreases engine efficiency. Further, the minimum size of the impingement cooling holes required to avoid clogging of the holes often produces a flow volume of impingement cooling air that has a greater capacity to remove heat from the component than is necessary. In other words, a greater volume of cooling fluid may be delivered to the surface to be cooled than is actually required to sufficiently cool the surface. This extra volume of air may not be fully utilized, yet has been taken from the combustor. As a result the combustor operates at reduced efficiency.

Often impingement cooling air is then utilized to provide film cooling on the hot surface of the component via a film cooling hole that delivers the post impingement cooling air to the hot gas path. This film of post-impingement cooling air separates the surface of the component from the hot combustion gasses, and this helps to keep the surface cooler. However, film cooling air may also negatively impact engine performance by slowing the flow of the combustion gasses and by imparting turbulence to the flow (e.g. mixing losses). Any extra volume of cooling fluid in excess of the minimum necessary to sufficiently cool the surface further increases the negative impacts of film cooling on engine performance.

These problems are exacerbated in certain gas turbine engine designs where the combustion gasses are accelerated to approximately mach 0.8 as they exit the combustor, as opposed to conventional designs where this happens upon entering the first stage of the turbine. In such designs, a static pressure difference across the wall of the component that defines the hot gas path is greater than in conventional designs because the hot combustion gasses inside the component are moving much faster. This increased static pressure difference forces more cooling air through the impingement cooling holes than in the conventional design. Further, the greater static pressure difference increases the mixing losses, further reducing engine efficiency. Therefore, there exists a need in the art for improved cooling of components exposed to high operating temperatures.

BRIEF DESCRIPTION OF THE DRAWINGS

The invention is explained in the following description in view of the drawings that show.

DETAILED DESCRIPTION OF THE INVENTION

Figure 1:
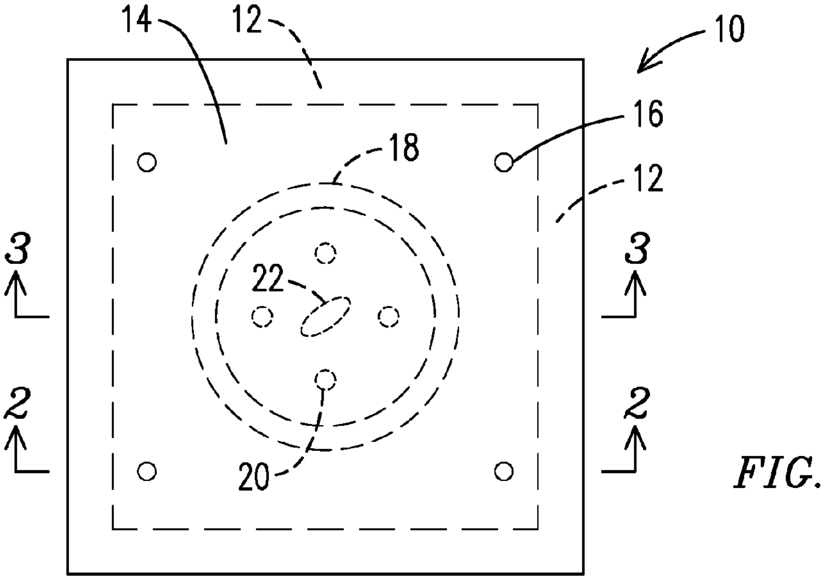
FIG. 1 is a top view of a single structural pocket of the cooling system.

An improved cooling system for components exposed to extreme high temperatures is disclosed herein. Such a component may be a component of an internal combustion engine, including a gas turbine engine. Various designs of such components may have pockets on the relatively cool side. These pockets may be there for structural strength or may be the result of other design considerations. An example, not meant to be limiting, of such a component is an advanced transition system that directs combustion gasses from a combustor to a first row of turbine blades. One such design is described in U.S. Pat. No. 7,721,547. In this design combustion gasses are accelerated from the end of the combustor to approximately 0.8 mach. The increased speed of the combustion gasses within the duct creates a larger static pressure difference between outside the component and inside the component than exists in conventional transition designs where the combustion gasses are moving much slower. The advanced transition component may have a thin wall to increase cooling and reduce thermal stresses, and the cool side may have continuous raised ribs to increase structural strength to accommodate this increased pressure difference, as described in United States Patent application titled "A Method of Fabricating a Nearwall Nozzle Impingement Cooled Component for an Internal Combustion Engine", by C. P Lee et al., filed Apr. 27, 2011, application Ser. No. 13/094,966. The raised ribs create relatively deep pockets throughout much, if not all, of the outer surface of the component. These pockets, particularly when relatively deep, pose a particular challenge in terms of cooling. Conventional cooling schemes have proven unsatisfactory for the advanced transition duct because many impingement cooling holes are needed to effectively distribute cooling air across the inner surface of the pocket. This great number of impingement cooling holes coupled with the increased pressure driving the cooling fluid through the impingement holes results in more cooling air being delivered than is actually needed to cool the component. The manufacturing limitations and clogging considerations prevent reducing the size of the cooling holes in order to reduce the flow volume.

The present inventors have devised a system that cools a component yet requires a reduced volume of cooling air when compared to conventional cooling schemes because the system takes advantage of more of the cooling capacity of the cooling air that is used. Using more of the cooling capacity of the cooling air means that less cooling air needs to be diverted from combustion and used to cool the component. Using less cooling air increases engine efficiency because less air is taken from the combustion process. Further, the reduced volume of cooling air means reduced aerodynamic losses associated with the mixing of the cooling air with the combustion gasses. The innovative system disclosed herein accomplishes the above using a structure that induces minimal thermal stress on the component. Some embodiments do so using a seal that improves as a temperature of the component increases. In some embodiments impingement cooling and film cooling cooperate with each other to more effectively cool the component.

The present cooling scheme stages the cooling of the wall by separating the outer surface to be cooled into a plurality of regions, and impingement cooling each region using the same cooling air in a series pathway. In this manner, a pressure drop large enough to throttle the flow to an acceptably low rate is provided without the need to use hole sizes that present a clogging concern, and each pressure drop is used to accomplish a heat transfer which combined is more effective in removing heat than would be a similar pressure drop accomplished with only a single impingement hole. In one embodiment the number of regions is two, but more regions are equally possible. In one embodiment this staging is accomplished by enclosing each structural pocket with a plate and then physically separating the inner surface of the structural pocket into a first region and the second region, where the cooling air enters the pocket through the first region and exits the pocket through the second region. This physical separation ensures that cooling air follows the series path cooling circuit as intended. In an embodiment the physical separation is achieved using an inner wall formed inside the structural pocket and integral to the component, where the inner wall forms an inner pocket inside the structural pocket, and a cap is placed on the inner wall. In an embodiment the cap forms a seal with the inner wall and includes impingement cooling holes; however a seal is not necessary. This design creates a cooling circuit with a first stage and a second stage within the pocket.

Cooling air is directed through at least one impingement cooling hole in the plate and onto the surface of the wall within the first region. That cooling air then travels through at least one impingement cooling hole in the cap and impinges on the surface of the wall within the second region. The spent impingement cooling air then exits the pocket, such as through a film cooling hole to form a cooling film on an inner side of the wall. In this manner, the cooling air flow is directed to impinge upon the surface of the wall not once, but twice within each pocket. Each impingement as well as the film cooling hole accomplishes a drop in the pressure of the cooling air and also accomplishes a heat transfer from the wall to the cooling air. Because the total pressure drop is distributed among the several heat transfers, each pressure drop can be accomplished with a respective hole size that is large enough to pass a design basis particle size without clogging of the cooling holes in the flow path.

Conventional cooling schemes that introduce structures to cool the component may also introduce thermal stress on the component. For example, when the cooling structure is fixed to the component and each has a different thermal expansion due to temperature differences, thermal stresses may result. These thermal stresses may decrease a service life of the components. The design disclosed herein avoids these unwanted thermal stresses by thermally and mechanically decoupling the cap from the inner wall. A mechanical joint between the inner wall and cap holds the cap in place yet permits the cap to expand and contract with respect to the inner wall. Some embodiments take advantage of the thermal mismatch to improve a seal between the inner wall and the cap at operating temperatures of the component. In particular, the cap is thermally and mechanically decoupled from an upper end of the inner wall so the upper end of the inner wall is free to move with respect to the abutting surface of the cap. This decoupling may improve service life of the component and improve seal-dependent operation.

Further, such conventional cooling schemes may be formed integral to the component. This may require complicated casting and core removal techniques. However, the present invention does not require these techniques. Instead, the cooling structures may be readily fabricated using sheet metal, or any similar structure. This represents a particular advantage given that some components may have as many as thousands of the structural pockets that require cooling.

Figure 2:
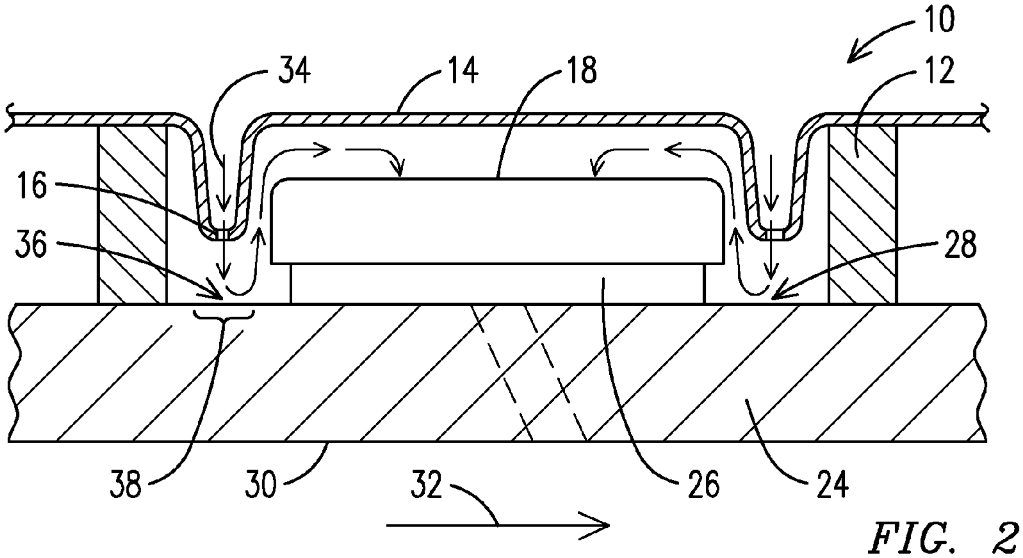
FIG. 2 is a cross section along A-A of the single structural pocket of FIG. 1.
Figure 3:
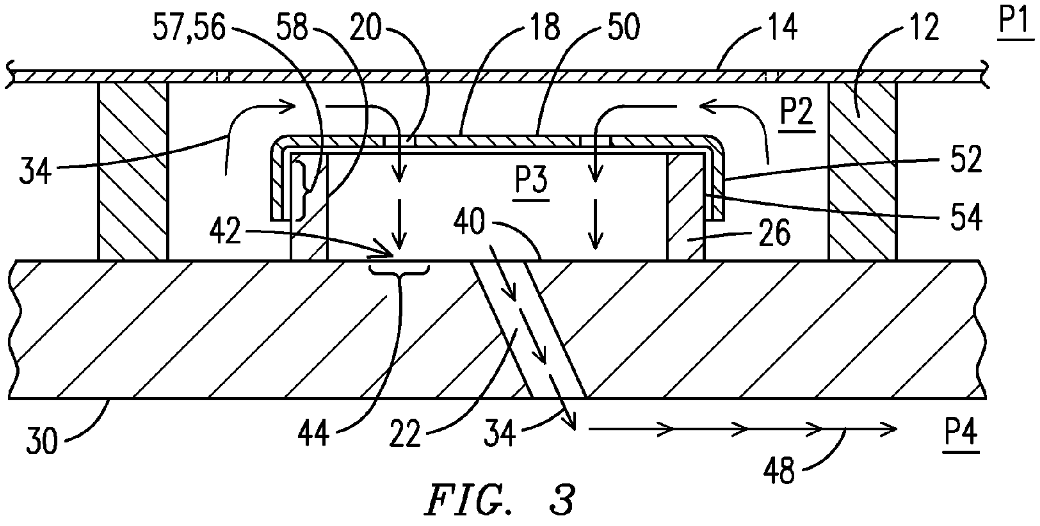
FIG. 3 is a cross section along B-B of the single structural pocket of FIG. 1.

Turning to the drawings, FIG. 1 shows a top view of a single structural pocket 10 of the cooling system. Raised ribs 12 define the structural pocket 10. The physical characteristics of the pocket 10 are designed based upon the structural requirements for the component. Cooling of the pocket 10 is then accomplished with other structures which do not create any significant mechanical loads on the component. These structures include plate 14, plate impingement cooling holes 16, cap 18, cap impingement cooling holes 20, and film cooling hole 22. The plate 14 may be joined to the raised ribs 12 in any number of ways, including mechanically joined or tack/seam welded etc. FIG. 2 is the view along A-A of FIG. 1. Visible are the component wall 24, raised ribs 12, plate 14, inner wall 26, cap 18, and plate impingement cooling holes 16. In this embodiment plate impingement cooling holes 16 are disposed on a section of the plate 14 lowered to place the plate impingement cooling holes 16 closer to the inner pocket surface. The inner pocket is divided into a first volume outside the inner wall 26 and a second volume enclosed by the inner wall 26. The surface is likewise divided into a first region 28 outside the inner wall 26, and a second region (not shown) inside the inner wall 26. An inner surface 30 of the component wall 24 partly defines a path for combustion gasses that travel along a combustion gas direction of travel 32. Cooling air 34 travels through plate impingement cooling hole(s) 16 and impinges the first region 28 at a first region point of impingement 36, creating an impingement cooled portion 38 of the first region 28, completing a first stage of the cooling. As shown in FIG. 3, which is B-B of FIG. 1, this cooling air then travels through cap impingement cooling hole(s) 20 and impinges the second region 40 at a second region point of impingement 42, creating an impingement cooled portion 44 of the second region 40. The cooling air 34 then leaves the volume under the cap through a film cooling hole 22 to create a film 48 between the hot gasses and the inner surface 30. Because the flow rate is effectively throttled by the series of pressure losses through the two cooling holes 16, 20, the blowing ratio (speed of cooling fluid verses speed of hot combustion gasses) is low enough to prevent separation of the cooling fluid from the inner surface 30, thereby providing an effective insulating effect. Also visible is a span 50 and skirt 52 of the cap 18. The span is the portion of the cap 18 that spans the inner wall 26, and the skirt 52 drops around the inner wall 26 and contacts an outer surface 54 of the inner wall 26 at an abutting region 56. Cap 18 may be held on the inner wall 26 in any number of ways including via force produced through a spring action of the skirt 52 acting on the inner wall 26, interlocking features, and/or spot welding. A seal 57 may form at the abutting region 56. Alternately, skirt 52 may contact an inner surface 58 to form a seal.

The cooling system takes advantage of various pressures P1, P2, P3, and P4 to ensure the cooling air 34 flows optimally. Pressure P1 is greatest, and pressure gradually decreases from P2 to P3 to P4. Plate 14 serves to decrease the pressure from P1 to P2, and thereby regulates the flow of cooling air 34. The size of plate impingement cooling holes 16 may vary as design requires, as does the size of cap impingement cooling holes 20. Together they must be sized to deliver sufficient air to accomplish the required cooling of both stages. Ideally they would deliver very little extra cooling air. However, many factors may be considered in order to optimize the design, including a ratio of the size of the first region 28 and the second region 40, changes in temperature of the cooling air 34 as it enters the respective region, different pressure P1 along an axial length of the component, and different operation conditions of the component, to name a few. The pressure P2 is greater than P3 and this drives the cooling air 34 through cap impingement cooling holes 20, and the pressure P3 is greater than pressure P4, likewise driving the cooling air 34 through film cooling hole 22. Film cooling hole 22 must also be properly sized such that the cooling air 34 does not separate from the inner surface 30. In one embodiment, the ratio of the number of cooling holes per unit of surface area can be made lower in the first region 28 than in the second region 40 due to the relatively cooler temperature of the cooling air in the respective impingement jets.

Figure 4:
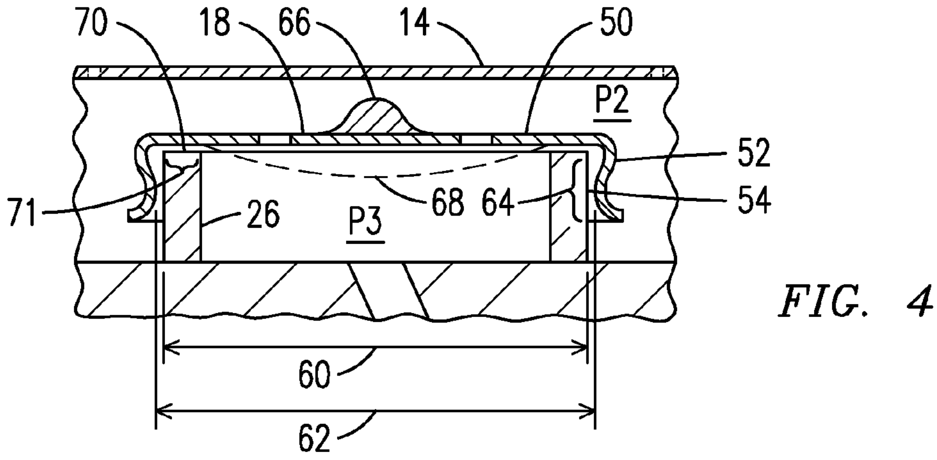
FIGS. 4-17 are cross sections of alternate embodiment of the structural pocket of FIG. 1.

In FIG. 4 an embodiment is shown where the inner wall 26 has an inner wall outer diameter 60, and the cap 18 has a cap inner diameter 62. The cap 18 and the outer surface 54 of the inner wall 26 form a seal at 64. In an embodiment where the inner wall 26 has a greater thermal expansion than the cap 18, upon heating the inner wall outer diameter 60 may increase at a rate greater than the cap inner diameter 62. This differential thermal expansion would tend to press the skirt 52 and the outer surface 54 of the inner wall 26 together, and this would increase the effectiveness of the seal therebetween. Also visible is stop feature 66 disposed on the cap 18. This optional feature may be used to prevent any instance where, for any unforeseen reason, cap 18 may start to work itself off of the inner wall 26. In such an instance, the stop feature 66 would contact the plate 14 this contact and would hold the cap 18 in place.

In this embodiment skirt 52 is also curved. Such a design may help ensure a proper seal in the event where P2 produces a deflection 68 in the span 50 of the cap 18. Normally, such a deflection 68 might tend to separate the skirt 52 from the outer surface 54 of the inner wall 26. However, in an embodiment where the skirt 52 is biased inward, when the span 50 deflects, the bias will hold the skirt 52 against the outer surface 54 of the inner wall 26, and the curve will accommodate any rotation of the skirt 52 in order to retain the seal. In addition to the seal at 64, the pressure difference P2-P3 that may produce deflection 68, the pressure difference P2-P3 also presses the span 50 onto an upper end 70 of the inner wall 26. Consequently, a second seal may form at 70. The pressure difference P2-P3 not only holds the cap 18 in place, but it also improves the seal at upper end 70. Further, both the seal 64 on the outer surface 54 and the seal 71 at upper end 70 are formed by abutting surfaces of the cap 18 and inner wall 26, yet the abutting surfaces of each seal are free to expand and contact with respect to each other. As a result, when the cap 18 and inner wall 26 form a seal they are still thermally and mechanically decoupled from each other, and thus thermal stresses are reduced.

Figure 5:
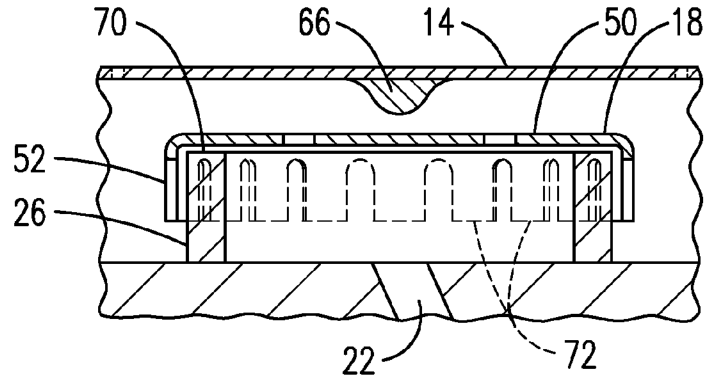
Figure 6:
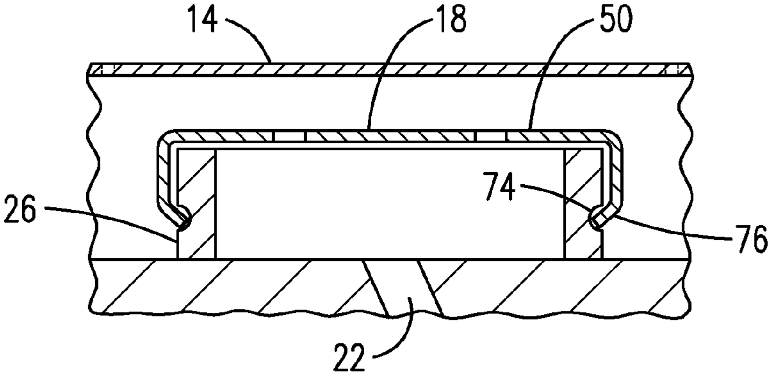
Figure 7:
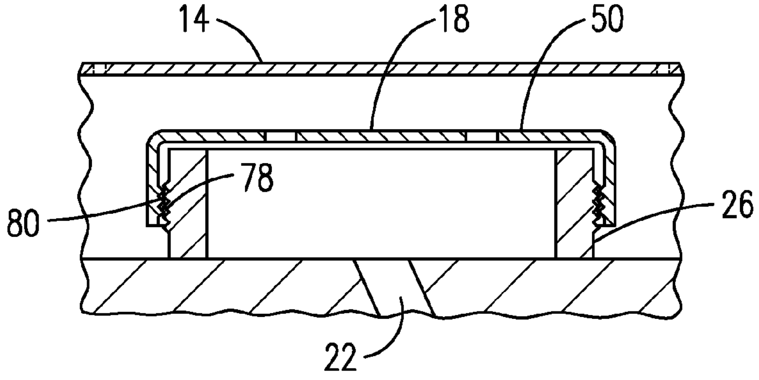
Figure 8:
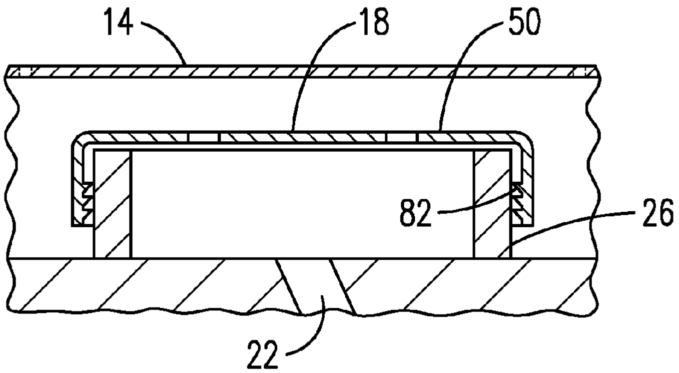

In an embodiment shown in FIG. 5, a plurality of fingers 72 form a discontinuous skirt 52 that holds the cap 18 in place. In such an embodiment there may not be a seal formed between the skirt 52 and the inner wall 26. Alternately, a seal may form between the inner wall 26 upper end 70 and the span 50 of the cap 18. Stop feature 66 is also disposed on plate 14. In FIG. 6 the inner wall 26 comprises an inner wall feature that engages a skirt feature to hold the cap 18 in place. In this embodiment the inner wall feature comprises a recess 74 and the skirt feature comprises a tap 76 that fits into the recess 74. In FIG. 7 the inner wall feature comprises a male thread 78 and the skirt feature comprises a female thread 80. In FIG. 8 the skirt feature comprises barbs 82 which engage the inner wall 26.

Figure 9:
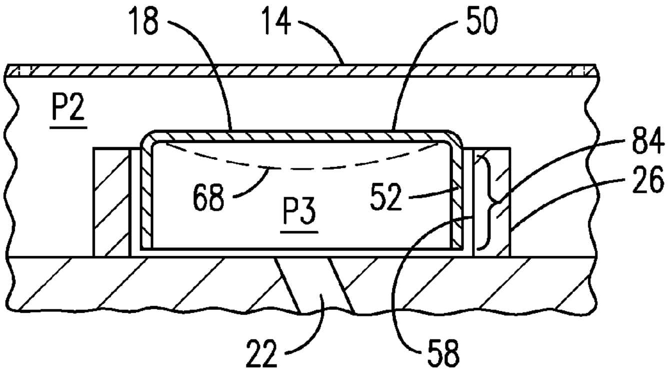
Figure 10:
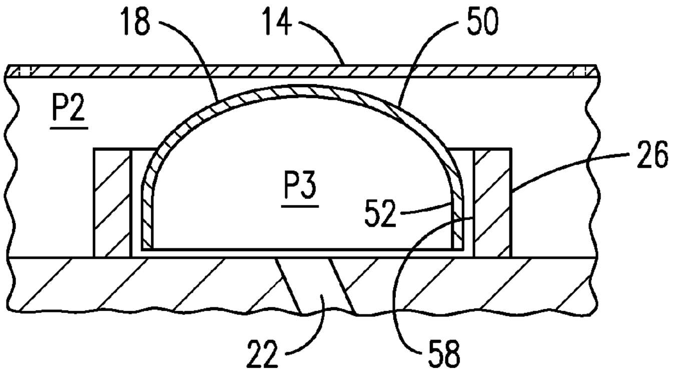
Figure 11:
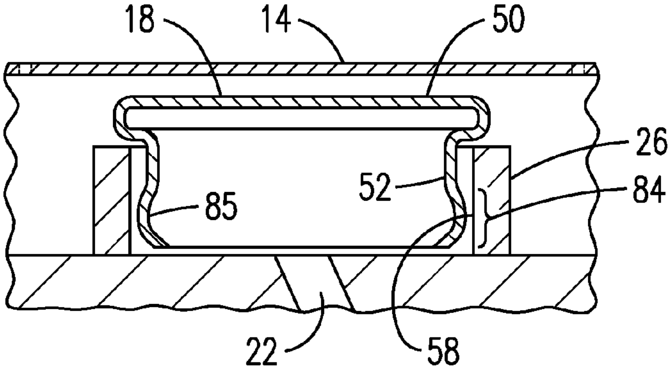
Figure 12:
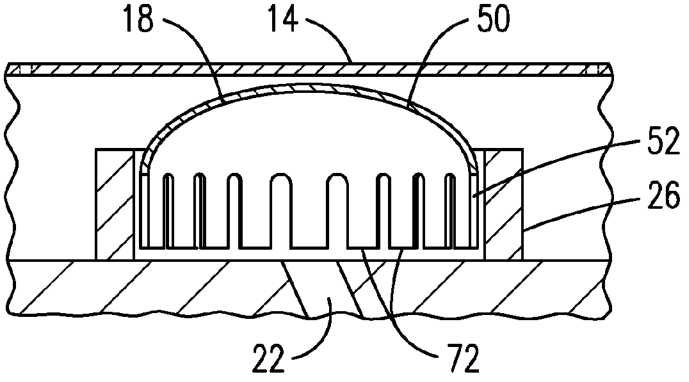
Figure 13:
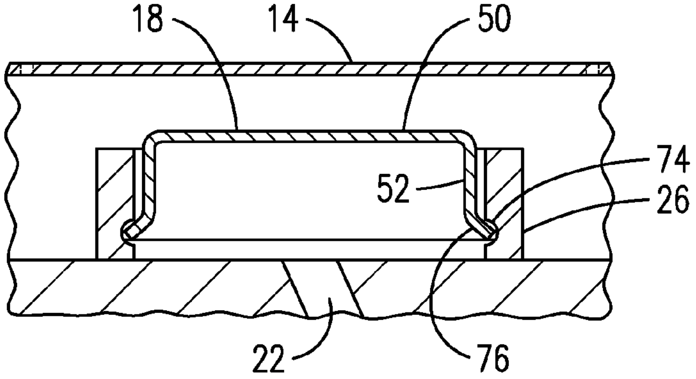
Figure 14:
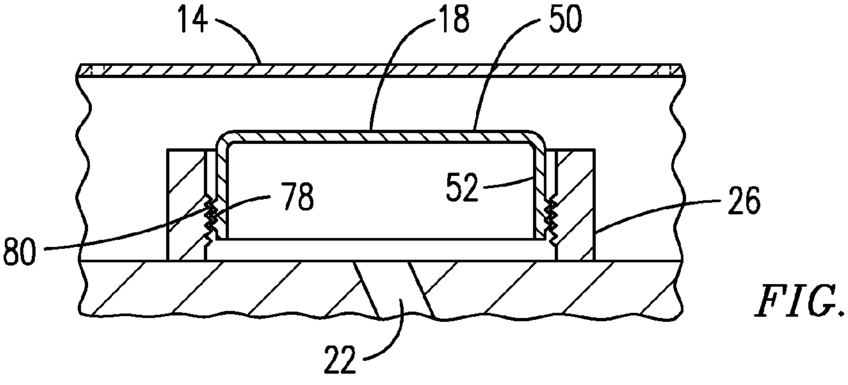
Figure 15:
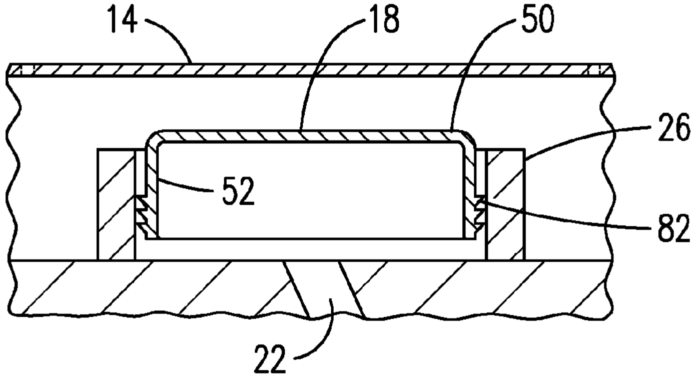

In an alternate configuration of the cap 18, as shown in FIGS. 9-17, the skirt 52 may contact and/or form a seal with the inner surface 58 of the inner wall 26. As shown in FIG. 9, the span 50 may be planar in embodiments where the skirt 52 contacts the inner surface 58, and this produces an advantage. Specifically, force resulting from the pressure difference P2-P3 that might produce a deflection also serves to press the skirt 52 outward so that the effectiveness of a seal created at 84 between the skirt 52 and the inner surface 58 of the inner wall 26 will be improved. Further, in an embodiment, the coefficient of thermal expansion of the cap 18 may be greater than that of the inner wall 26, and thus during heating the cap 18 may expand at a rate greater than the inner wall 26, and this would tend to press the skirt 52 and the inner surface 58 of the inner wall 26 together, increasing the effectiveness of the seal 84 there between. As shown in FIG. 10, the span 50 may not be planar, but may be curved. Such a configuration will reduce or eliminate any deflection 68 that may occur with a planar span 50 as a result of the pressure difference P2-P3. Similar to FIG. 4, FIG. 11 shows a skirt 52 with a curved portion 85 to ensure a seal at 84 is retained regardless of any deflection of span 50 and associated rotation with the skirt 52. FIGS. 12-15 show various embodiments of the interaction of the skirt 52 with the inner wall 26.

Figure 16:
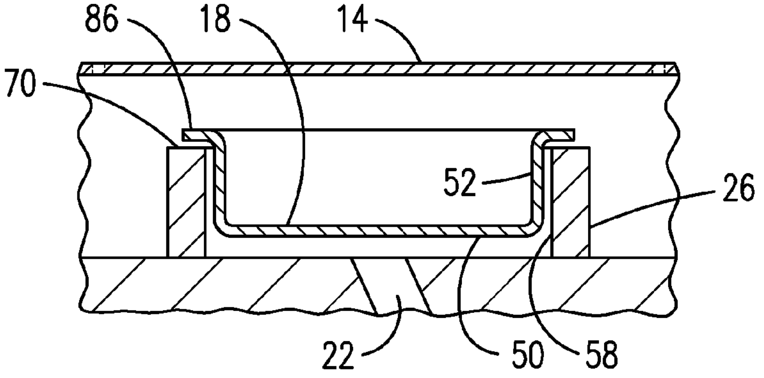
Figure 17:
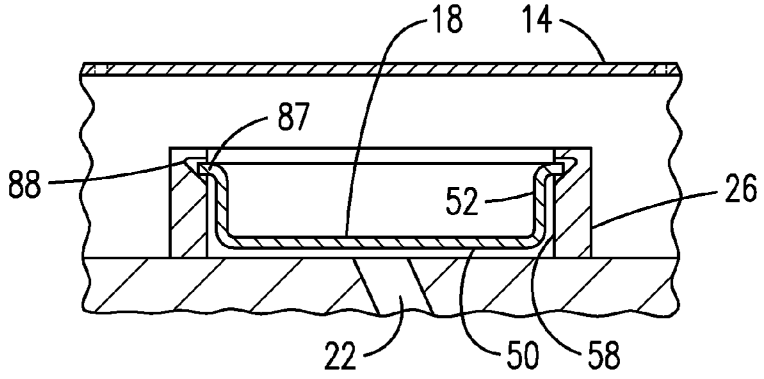

In FIG. 16 the cap may be inverted with respect to earlier embodiments, such that the span 50 may be below the skirt 52. Such an embodiment would enable positioning of the cap impingement cooling holes 20 (not shown) closer to the surface in the second region 40, which would improve the effects of the impingement cooling. In such embodiments the seals could form between the skirt 52 and the inner surface 58 and/or an extension 86 of the skirt 52 and the upper end 70 of the inner wall 26. In the embodiment of FIG. 17, the skirt 52 may have a skirt feature such as a tab 87 that fits into an inner wall feature such as a recess 88 to help retain the cap 18 in place. Any combination of the above-described embodiments can be used in order to achieve the staged cooling.

Figure 18:
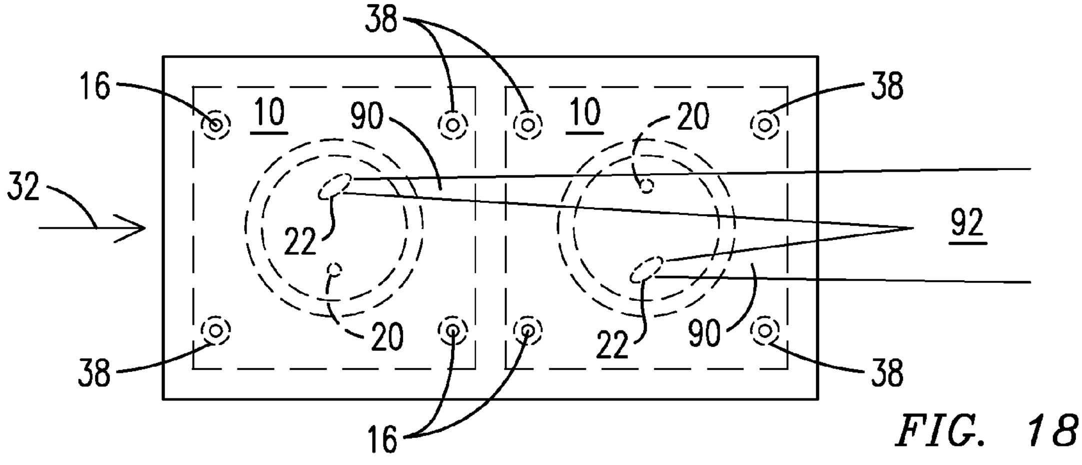
FIG. 18 depicts film cooling of adjacent structural pockets of the cooling system.

In an embodiment shown in FIG. 18, structural pockets 10 that are upstream/downstream adjacent to each other with respect to the direction 32 of combustion gasses may have film cooling holes 22 that are staggered laterally with respect to the direction 32 of combustion gasses. In this manner a plurality of single films 90 may eventually form a united film 92 that is wider than a single film 90. In an embodiment the film cooling holes 22 may also be positioned such that either the single film 90, or the united film 92 passes between impingement cooled portions 38 of the first region 28. (Solid circles inside the impingement cooled portions 38 indicate where the plate impingement cooling holes 16 would be positioned.) In this manner the film cooling effects will be greatest where the impingement cooling effects are least, and likewise the impingement cooling effects will be greatest where the film cooling effects are least.

Figure 19:
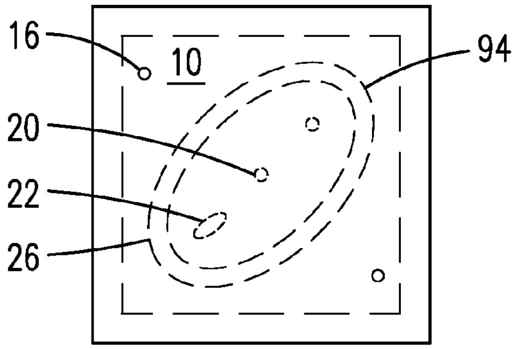
FIGS. 19-20 show alternate embodiments of the adjacent structural pockets of FIG. 18.
Figure 20:
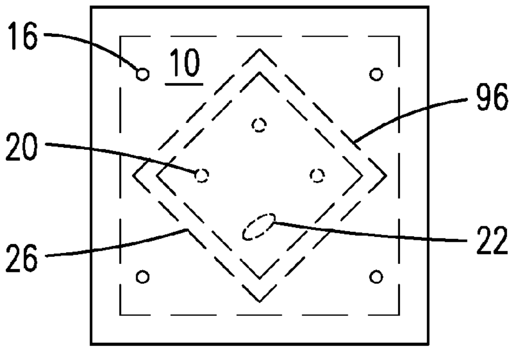

Numerous variations in the number, size, and shape of the plate impingement cooling holes 16, the cap impingement cooling holes 20, and the film cooling holes 22 are possible, and limited only by the cooling conditions required for each structural pocket 10 and the local region of that structural pocket 10. Further, a pattern of the holes used in one pocket need not be the same as adjacent pockets. For example, one pattern may be used at one location of the component where a certain pressure P1 exists, and another may be used where the pressure P1 is slightly different. Further demonstrated in FIGS. 19 and 20 is that the inner pocket my comprise a shape other than circular, and may be an oval inner pocket 94 or a square inner pocket 96.

The unique cooling system disclosed herein represents an improvement in the art because it decreases the amount of air extracted from the combustion flow for use as cooling air, it increases the efficiency of the use of that cooling air, it provides more air for combustion, and it decreases losses due to the entry of spent cooling air into the combustion gasses. The system reduces thermal stresses, thereby extending the life of the component, and it is more easily manufactured than conventional systems, and thus represents a cost savings.

While various embodiments of the present invention have been shown and described herein, it will be obvious that such embodiments are provided by way of example only. Numerous variations, changes and substitutions may be made without departing from the invention herein. Accordingly, it is intended that the invention be limited only by the spirit and scope of the appended claims.

The invention claimed is:

1. A system for cooling a wall of a gas turbine engine component heated by a flow of a hot gas across an inner surface of the wall, the wall having an outer surface comprising raised ribs defining a plurality of structural pockets, the system comprising:

an inner wall within each structural pocket, the inner wall extending from the wall outer surface within a respective structural pocket and separating the wall outer surface within the respective structural pocket into a first region outside of the inner wall and a second region enclosed by the inner wall, wherein the inner wall is spaced apart from the raised ribs, and an outer surface of the inner wall in contact with the first region and enclosing an inner surface of the inner wall;

a plate disposed atop the raised ribs and enclosing the plurality of structural pockets, the plate comprising a plurality of plate impingement holes, each configured to direct cooling air from outside each respective structural pocket onto an impingement cooled area of the first region within each respective structural pocket;

a cap within each structural pocket, comprising a skirt that extends toward the wall and that is in contact with the outer surface of the inner wall within each respective structural pocket, wherein the skirt encloses the inner wall and configured to secure the cap in position over the respective second region, the cap comprising a cap impingement hole configured to direct the cooling air that has impingement cooled the respective first region onto an impingement cooled area of the respective second region, and;

a film cooling hole formed through the wall in the second region for removing the cooling air from the respective structural pocket.

2. The system of claim 1, wherein at least one cap forms a seal with a respective inner wall.

3. The system of claim 1, wherein a geometric feature of at least one skirt engages a geometric feature of the respective inner wall to hold the respective cap in position.

4. The system of claim 1, wherein resilience of at least one cap urges the respective skirt against the outer surface of the respective inner wall to hold the at least one cap in position.

5. The system of claim 1, wherein at least one skirt comprises barbs that engage the respective inner wall.

6. The system of claim 1, wherein with respect to a direction of flow of the hot gas, at least one film cooling hole is offset laterally from a film cooling hole of an adjacent structural pocket disposed upstream or downstream.

7. The system of claim 1, wherein with respect to a direction of flow of the hot gas, at least one film cooling hole is disposed upstream of an area of the respective first region remote from the impingement cooled area of the respective first region.

8. The system of claim 1, wherein with respect to a direction of flow of the hot gas, at least one film cooling hole is offset laterally from the impingement cooled area of the respective first region.

9. The system of claim 1, wherein either at least one cap or at least one plate comprises a stop feature configured to prevent the respective cap from lifting off the respective inner wall.

10. The system of claim 1, wherein at least one plate impingement hole is disposed on a portion of the respective plate lowered toward the respective first region relative to another portion of the respective plate.

11. The system of claim 1, further comprising a seal between at least one cap and the respective inner wall configured such that differential thermal expansion caused by heating of the component from ambient to an operational temperature tightens the seal.

12. The system of claim 1, wherein at least one skirt is rounded where the at least one skirt contacts the respective inner wall and thus retains contact if a span of the respective cap deflects due to a pressure difference across the span.

13. The system of claim 1, wherein in at least one structural pocket a ratio of cooling holes per unit of surface area is lower in the first region than in the second region.

14. A system for cooling a wall of a gas turbine engine component, the wall being exposed during operation of the gas turbine engine to a relatively higher pressure cooling air on a first side and to a relatively lower pressure hot combustion gas on an opposed second side, the system comprising:

a transition duct comprising the wall;

structural ribs extending from the first side of the wall and defining a structural pocket and plural adjacent structural pockets;

an inner wall extending from the first side of the wall within the structural pocket and separating the structural pocket into a first volume outside of the inner wall and a second volume enclosed by the inner wall, the inner wall extending from the first side to a height lower than a height of the structural ribs and spaced apart from the raised ribs, and an outer surface of the inner wall in facing the first volume and enclosing an inner surface of the inner wall;

a plate disposed atop the structural ribs and enclosing the structural pocket and the plural adjacent structural pockets;

a cap enclosing the second volume and comprising a skirt that extends toward the wall and that is in contact with the outer surface of the inner wall;

a series flow path for cooling air from the relatively higher pressure first side to the relatively lower pressure second side comprising a plate impingement hole, the first volume, a cap impingement hole, the second volume, and a film cooling hole through the wall where the wall defines part of the second volume;

the plate impingement hole and first volume effective to accomplish a first pressure drop in the cooling air and a first heat transfer from the wall to the cooling air;

the cap impingement hole and the second volume effective to accomplish a second pressure drop in the cooling air and a second heat transfer from the wall to the cooling air;

the film cooling hole effective to accomplish a third pressure drop in the cooling air and a third heat transfer from the wall to the cooling air and to create a film cooling layer along the second side.

15. The system of claim 14, wherein with respect to a direction of flow of the hot combustion gas, the film cooling hole is offset laterally from the plate impingement hole and the cap impingement hole.

16. A system for cooling a hot wall of a gas turbine engine component comprising an outer side comprising continuous raised ribs defining discrete structural pockets, comprising:

a plurality of discrete structural pockets, each of the discrete structural pockets comprising an inner pocket that is defined by a continuous inner wall, the continuous inner wall comprising an inner surface that defines the inner pocket, and an outer surface that faces away from the inner pocket and encloses the inner surface, wherein the continuous inner wall is spaced apart from the continuous raised ribs;

a plate disposed atop the continuous raised ribs, thereby enclosing the plurality of discrete structural pockets, the plate comprising a plate impingement hole for each of the plurality of discrete structural pockets that is configured to direct cooling air toward a respective structural pocket surface outside the respective inner pocket;

a discrete cap disposed on each continuous inner wall to enclose the inner pocket, each cap comprising a skirt that extends toward the hot wall and that is in contact with the outer surface of the continuous inner wall, and a cap impingement hole configured to direct respective cooling air toward a respective pocket surface inside the respective inner pocket, wherein abutting surfaces of the cap and the respective continuous inner wall are free to thermally expand and contract with respect to each other;

a film cooling hole in each discrete structural pocket that is configured to deliver the respective cooling air from respective inner pocket through an inner side of the hot wall.

17. The system of claim 16, wherein the abutting surfaces of at least one cap and a respective continuous inner wall form a seal effective to block cooling air from flowing there between.

18. The system of claim 16, wherein at least one cap comprises a skirt that forms a seal with the outer surface of the respective inner wall.

* * * * *